United States Patent [19]

Ishida

[11] Patent Number: 5,590,461
[45] Date of Patent: Jan. 7, 1997

[54] METHOD OF MAKING MULTI-LAYER WIRING BOARD

[75] Inventor: Hisashi Ishida, Tokyo, Japan

[73] Assignee: NEC Corporation, Tokyo, Japan

[21] Appl. No.: 467,809

[22] Filed: Jun. 6, 1995

Related U.S. Application Data

[62] Division of Ser. No. 230,699, Apr. 21, 1994, Pat. No. 5,534,666.

[30] Foreign Application Priority Data

Apr. 21, 1993 [JP] Japan .................................. 5-117954

[51] Int. Cl.$^6$ ...................................... H05K 3/36
[52] U.S. Cl. ........................... 29/830; 174/255; 174/257; 174/258; 174/259; 428/901
[58] Field of Search ............................. 29/830; 174/255, 174/257, 258, 259; 428/901

[56] References Cited

U.S. PATENT DOCUMENTS

| | | |
|---|---|---|
| 4,803,595 | 2/1989 | Kraus et al. . |
| 5,111,003 | 5/1992 | Kimbara ................................. 174/255 |
| 5,224,265 | 7/1993 | Dux et al. . |
| 5,315,069 | 5/1994 | Gebara . |
| 5,321,210 | 6/1994 | Kimbara et al. . |
| 5,350,886 | 9/1994 | Miyazaki et al. . |
| 5,371,654 | 12/1994 | Beaman et al. . |
| 5,382,757 | 1/1995 | Ishda . |
| 5,396,034 | 3/1995 | Fujita et al. . |

FOREIGN PATENT DOCUMENTS

| | | |
|---|---|---|
| 0237808 | 9/1987 | European Pat. Off. . |
| 3-246993 | 5/1991 | Japan . |

*Primary Examiner*—Carl J. Arbes
*Attorney, Agent, or Firm*—Sughrue, Mion, Zinn, Macpeak & Seas

[57] ABSTRACT

A multi-layer wiring board has at least one stacking block with an insulating hard substrate, a grounding layer being provided in the insulating hard substrate. A plurality of wiring layers are provided over upper and lower major surfaces of the insulating hard substrate. A plurality of throughholes are provided in the insulating hard substrate for connecting wiring layers on the top and bottom surfaces of the substrate. A base block has an insulating base board, and at least one wiring layer provided over one major surface of the insulating base board. Connections electrically and mechanically connect the at least one stacking block and the base block. The stacking block and the base block may be simultaneously manufactured in parallel with others. The stacking block and the base block may be adhered to each other by an adhesive layer. Each electrical connection between the stacking block and the base block may be achieved with bumps and pads.

1 Claim, 10 Drawing Sheets

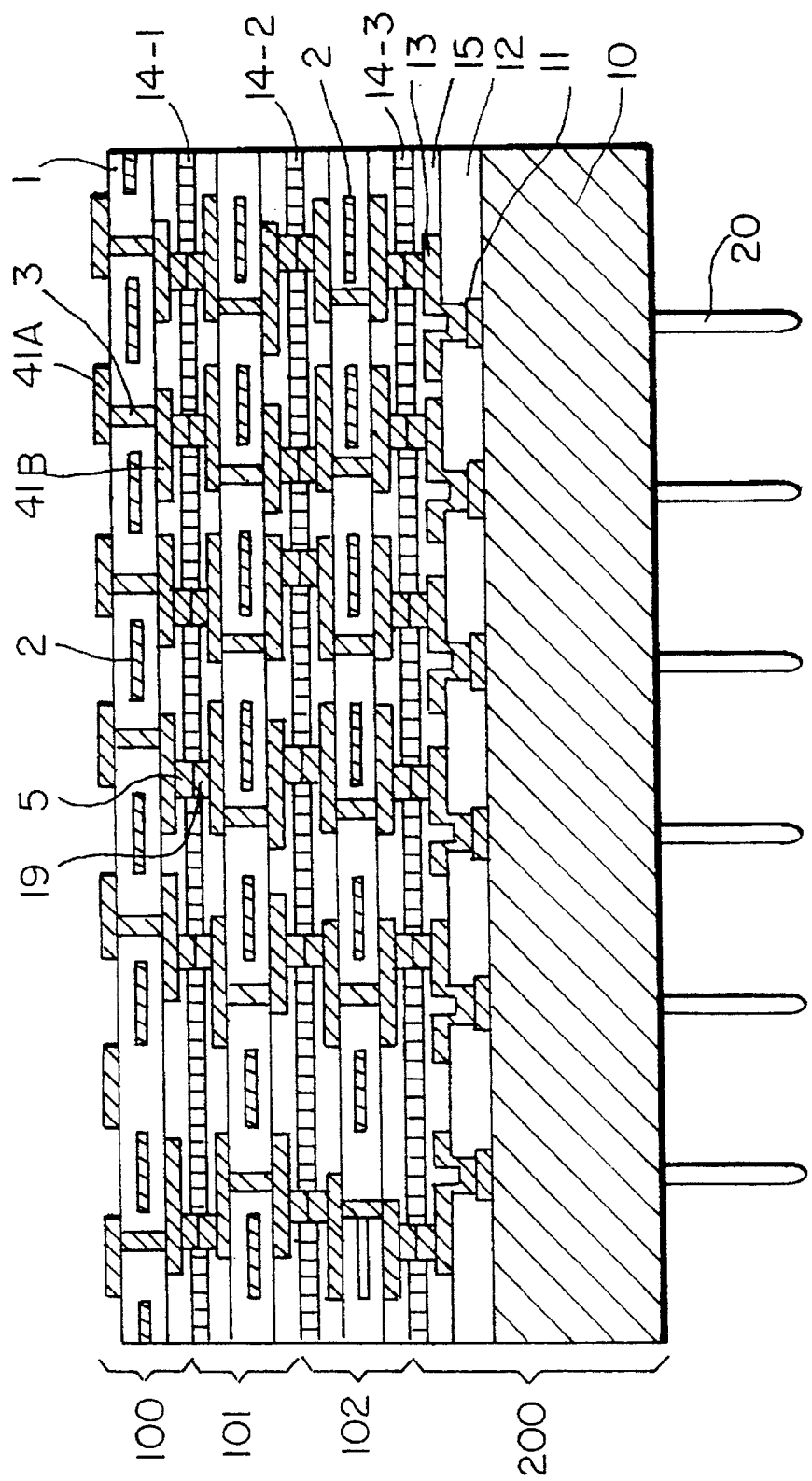

METHOD OF MAKING MULTI-LAYER WIRING BOARD

This is a divisional of application Ser. No. 08/230,699 filed Apr. 21, 1994, now U.S. Pat. No. 5,534,666.

BACKGROUND OF THE INVENTION

1. Field of the Invention

The present invention relates to a wiring board and a manufacturing method thereof, and more particularly to a multi-layer wiring board having multiple wiring layers using polyimide resin for inter-layer insulation, and a manufacturing method thereof.

2. Description of the Related Art

Multi-layer printed wiring boards have been used heretofore as the wiring boards on which to mount LSI chips.

A multiple printed wiring board has copper-sputtered stacked plates as a core and prepregs as an adhesive for connection between the copper-sputtered stacked plates, and the copper-sputtered stacked plates and prepregs are alternately stacked and integrated by thermal press processes.

Electrical connections between the copper-sputtered stacked plates are achieved by forming penetrating throughholes with a drill after the copper-sputtered stacked plates and prepregs are integrated, and coating the inner walls of the penetrating throughholes with copper.

Furthermore, in recent years, multi-layer wiring boards using polyimide resin over ceramic substrates for inter-layer insulation have come to be used as wiring boards for high performance computer use, where greater density than that of multi-layer printed wiring boards is required.

A polyimide ceramic multi-layer wiring board which has polyimide resin insulating layers and multiple wiring layers is formed by the repetition of following two processes.

Polyimide resin insulating layers are formed by supplying polyimide precursor varnish over a ceramic substrate, drying it and forming via holes in this coating film over the ceramic substrate.

Multiple wiring layers are formed by photolithographic methods, vacuum evaporation methods, and metal plate methods.

On the other hand, there also is a method to form a polyimide ceramic multi-layer wiring board by forming conductor lines as a signal layer over polyimide sheets, aligning these sheets over a ceramic substrate, and successively alternately stacking and pressing sheets over the ceramic substrate.

However, the above-mentioned multi-layer wiring boards have some following disadvantages.

For the above-mentioned multiple printed wiring board, since electrical connections between the copper-sputtered stacked plates are achieved by penetrating throughholes which are formed through from the top printed wiring board to the bottom printed wiring board with a drill, it is impossible to form physically minute penetrating throughholes in the signal wiring layer part of the multiple printed wiring board, and accordingly it is impossible to form a lot of conductor line between the penetrating throughholes over the copper-sputtered stacked plates.

Furthermore, one penetrating throughhole is always needed for electrical connection between every stacked plates, so that the capacity to accommodate signal conductor lines is reduced by an increase in the number of stacked layers, resulting in the disadvantage that it is difficult to form multiple printed wiring board having high wiring density.

On the other hand, since the above-mentioned polyimide ceramic multi-layer wiring board is always formed by the repetition of the processes of supplying polyimide precursor varnish over the ceramic substrate, drying it, forming via holes in the coating film and curing it as many times as the number of polyimide insulating layers stacked over the ceramic substrate, the stacking process of the polyimide resin insulating layers takes an extremely long time.

Moreover, since the above-mentioned polyimide resin insulating layers are always formed by the repetition of the processes of supplying polyimide precursor varnish over the ceramic substrate, drying it, forming via holes in the coating film and curing it, the thermal stress of the curing process which is repeated many times is applied on polyimide resin in the lower layer part of the polyimide resin insulating layers.

Therefore, it is difficult to improve the manufacturing yield of polyimide resin insulating layers because of deterioration of lower layer part of the polyimide resin insulating layers due to thermal stress of curing process.

On the other hand, since the above-mentioned polyimide ceramic multi-layer wiring board is always formed by forming conductor lines as a signal layer over polyimide sheets, aligning these sheets over a ceramic substrate, and successively alternately stacking and pressing sheets over the ceramic substrate, the thermal stress of stacking and pressing processes is applied on polyimide resin in the lower layer part of the polyimide resin insulating layers many times, and the polyimide resin in the lower layer part of the polyimide resin insulating layers is deteriorated and the stacking process of the polyimide resin insulating layers takes an extremely long time as a result.

SUMMARY OF THE INVENTION

It is therefore an object of the present invention to eliminate the above-mentioned disadvantages and provide a multi-layer wiring board and a manufacturing method thereof which prevent the polyimide resin insulating layer from heat deterioration.

It is another object of the present invention to eliminate the above-mentioned disadvantages and provide a multi-layer wiring board and a manufacturing method thereof which shortens the manufacturing time, and improves the manufacturing yield.

According to the present invention, a multi-layer wiring board has:
- a base block with an insulating base substrate, and at least one wiring layer formed over one major surface of the insulating base substrate;
- at least one stacking block, being stacked over the base block, having an insulating hard substrate, a grounding layer formed in the insulating hard substrate, wiring layers formed over at least one major surface of the insulating hard substrate, and throughholes formed in the insulating hard substrate for electrical connection between the wiring layers; and
- connections, formed on the at least one wiring layer of the base block and each top or bottom layer of the wiring layers of the at least one stacking block, for electrically and mechanically connecting the blocks to each other.

Furthermore, according to the present invention, a manufacturing method for a multi-layer wiring board includes the steps of:

providing a base block by forming at least one wiring
layer over one major surface of an insulating base
substrate;

providing at least one stacking block by forming a
grounding layer and throughholes in an insulating hard
substrate, and wiring layers over each major surface of
the insulating hard substrate;

forming selectively an adhesive layer on the top layer of
one major surface of the base block and the top or
bottom layer of each major surface of the at least one
stacking block; and laminating the at least one stacking block over the base
block using the adhesive layers to electrically and
mechanically connect the blocks to each other.

BRIEF DESCRIPTION OF THE DRAWINGS

The above objects and features of this invention will
become more apparent from the following detailed description when taken in conjunction with the attached drawings.

FIG. 3 is a cross-sectional view of still another embodiment of the structure of multi-layer wiring boards according
to the present invention;

In the drawings, the same reference numerals respectively
denote the same structural elements.

DESCRIPTION OF THE PREFERRED
EMBODIMENT

Next will be described embodiments of the present invention with reference to the drawings.

Figure 1:
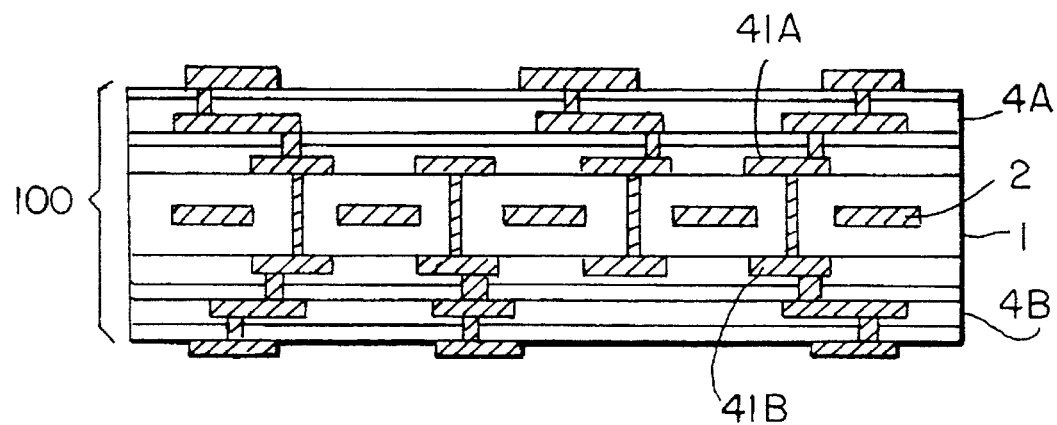
FIG. 1 is a cross-sectional view of one embodiment of the
structure of multi-layer wiring boards according to the
present invention.

Referring to FIG. 1, according to an embodiment of the
present invention, stacking block 100 has a substrate 1, a
grounding layer 2 formed therein, and throughholes 3 for
mutual connection between multiple signal wiring layer
parts 4A and 4B over the upper and lower surfaces of the
substrate 1.

Multiple signal wiring layer parts 4A and 4B formed over
the upper and lower surfaces of the substrate 1 each have
signal wiring layers and polyimide resin insulating layers as
will be described in detail hereinafter with reference to
FIGS. 5 and 6.

The substrate 1 as an insulating hard substrate may be
either an organic resin board resistant to heat of 450° C. or
more or a ceramic board or glass ceramic board having a
Rockwell hardness of 70 RCA or more.

Figure 2:
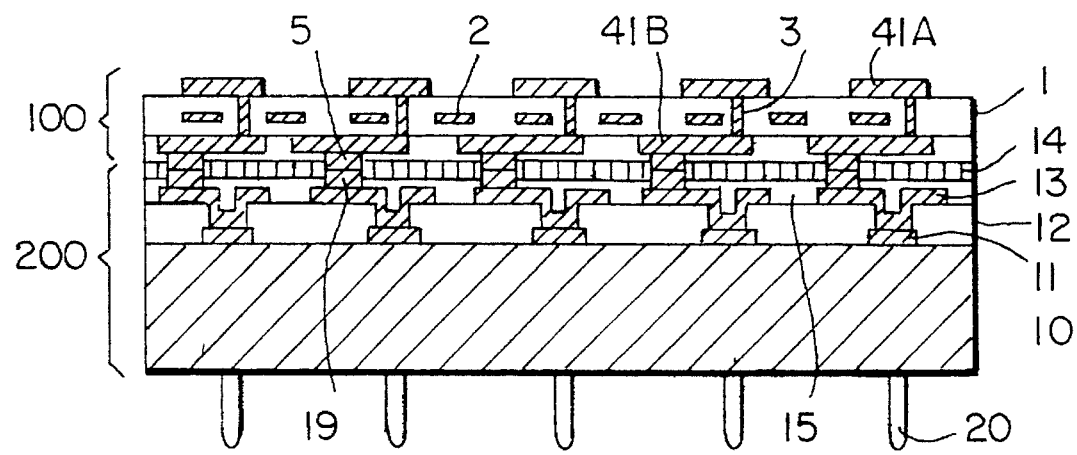
FIG. 2 is a cross-sectional view of another embodiment of
the structure of multi-layer wiring boards according to the
present invention.

Referring to FIG. 2, according to another embodiment of
the present invention, a multi-layer wiring board comprises
the stacking block 100 shown in FIG. 1 and a base block
200.

The stacking block 100 is stacked over the base block
200.

In this case, an insulating base substrate 10, which may be
made of baked alumina ceramic of the base block 200 has
input/output pins 20, molybdenum metal wiring layers 11
and 13 formed over one major surface thereof, and further
polyimide resin layers 12 and 15 formed for insulating
between molybdenum metal wiring layers 11 and 13.

It is also possible to provide hard heat-resistant organic
resin or glass ceramic as materials of the insulating base
substrate 10.

The signal wiring layer 13 of the base block 200 may be
gold-coated wiring of preferably about 25 μm in wiring
width and about 7 μm in wiring thickness.

The polyimide resin used for polyimide resin layers 12
and 15 is for instance, if it is non-photosensitive, PIQ
produced by Hitachi Chemical, PYRALYN produced by Du
Pont, SEMICOFINE produced by Toray or the like or, if it
is photosensitive, PL-1200 produced by Hitachi Chemical,
PI-2702D produced by Du Pont, PHOTONEITH produced
by Toray, PIMEL produced by Asahi Chemical or the like,
and the film thickness between the wiring layers is preferably about 20 μm.

The number of signal wiring layers is two, including the
layer 13 and a wiring layer 41B on the underside of the block
100.

A connecting pad 41A (equivalent to the wiring layer on
the topside of the block 100) is formed on the top layer by
copper coating for connecting LSI chips by soldering.

Whereas the structure of this embodiment comprises two
blocks 100 and 200, each block is electrically tested when it
is completed, and selected for use if it is satisfactory,
followed by advance to the next inter-block connecting
process.

Connections between the blocks are accomplished with an
adhesive 14, bumps 5 and pads 19.

Tight adhesion between the blocks is achieved with the
adhesive 14. The adhesive 14 may be polyimide resin
excelling in heat resistance. The film thickness of the
adhesive layer 14 is preferably about 10 μm.

Electrical connections between the blocks are achieved by
using the bumps 5 and the pads 19 formed in via holes in the
adhesive layer 14.

The materials for the bumps 5 and the pads 19 may be a
gold-tin multi-layer coating, gold coating and the like, and
their dimensions may be 50 to 300 μm². They are preferably
formed in film thicknesses of preferably about 10 to 50 μm.

Referring to FIG. 3, according to still another embodiment of the present invention, a multi-layer wiring board
comprises a base block 200 and three stacking blocks 100,
101 and 102, and these stacking blocks 100, 101 and 102 are
stacked over the base block 200.

In this case, the insulating base substrate 10 of the base
block 200 may be a baked alumina ceramic substrate, having
internal wiring layers 11 and 13 of molybdenum metal over
one major surface.

It is also possible to provide hard heat-resistant organic resin or glass ceramic as materials of the insulating base substrate 10.

Signal wiring 13 is preferably gold-coated wiring of about 25 μm in wire width and about 7 μm in wire thickness.

The polyimide resin used for polyimide resin layers 12 and 15 is for instance, if it is non-photosensitive, PIQ produced by Hitachi Chemical, PYRALYN produced by Du Pont, SEMICOFIN produced by Toray or the like or, if it is photosensitive, PL-1200 produced by Hitachi Chemical, PI-2702D produced by Du Pont, PHOTONEITH produced by Toray, PIMEL produced by Asahi Chemical or the like, and the film thickness between the wiring layers is preferably about 20 μm.

In this case, the number of signal wiring layers is six, having the basic configuration in which each of a signal wiring layer and an electrode layer is located on the topside and underside of the ceramic substrate 1 having a grounding layer and throughholes within, and three blocks 100, 101 and 102, each consisting of this configuration, are stacked over the base block 200.

A connecting pad 41A is formed on the top layer of the ceramic substrate 1 having a grounding layer and throughholes within (the stacking block 100) by copper coating for connecting LSI chips by soldering.

Each block is electrically tested when it is completed, and selected for use if it is satisfactory, followed by advance to the next inter-block connecting process.

Connections between the blocks are accomplished with an adhesive 14-1, 14-2 and 14-3, bumps 5 and pads 19.

Tight adhesion between the blocks is achieved with the adhesive 14-1 through 14-3. The adhesive 14 may be polyimide resin excelling in heat resistance. The film thickness of the adhesive layer 14 is preferably about 10 μm.

Electrical connections between the blocks are achieved by using the bumps 5 and the pads 19 formed in via holes in the adhesive layers 14-1 through 14-3.

The materials used for the bumps 5 and the pads 19 may be a gold-tin multi-layer coating, a gold coating and the like, and their dimensions are preferably about 50 to 300 μm². They are formed in film thicknesses of preferably about 10 to 50 μm.

Next will be described a manufacturing method for a multi-layer wiring board structure according to an embodiment of the present invention by using FIGS. 4A through 8.

First will be described the procedure of manufacturing a base block 200 with reference to FIGS. 4A through 4G.

Figure 4A:
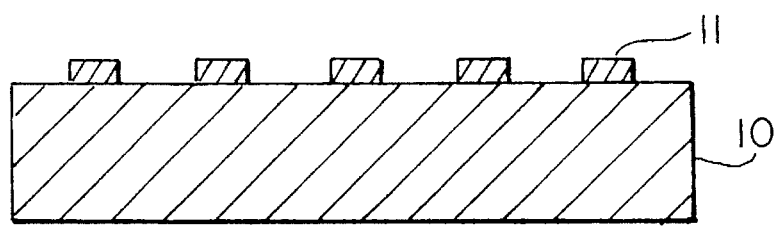
FIGS. 4A through 4G are cross-sectional views illustrating the process sequence of one embodiment of the manufacturing method for multi-layer wiring boards according to
the present invention.

First, as shown in FIG. 4A, a wiring layer is patterned by photolithography using a photoresist over the surface of the insulating base substrate 10 containing a conductor layer within, and electrolytic gold coating is carried out to form the wiring layer 11 of 10 μm in thickness.

Figure 4B:
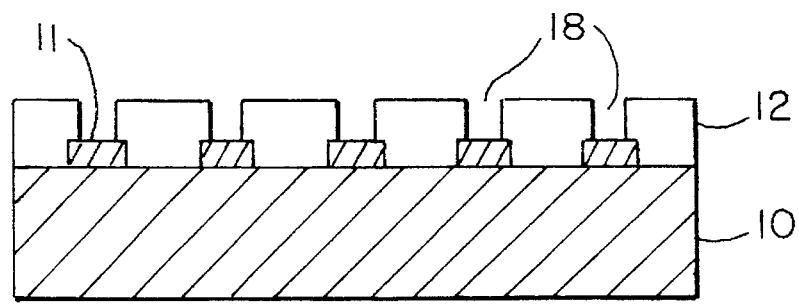

Next, as shown in FIG. 4B, photosensitive polyimide varnish is applied over the insulating base substrate 10 over which the wiring layer 11 has been formed, exposed to light and developed, and via holes 18 are formed in prescribed positions.

Figure 4C:
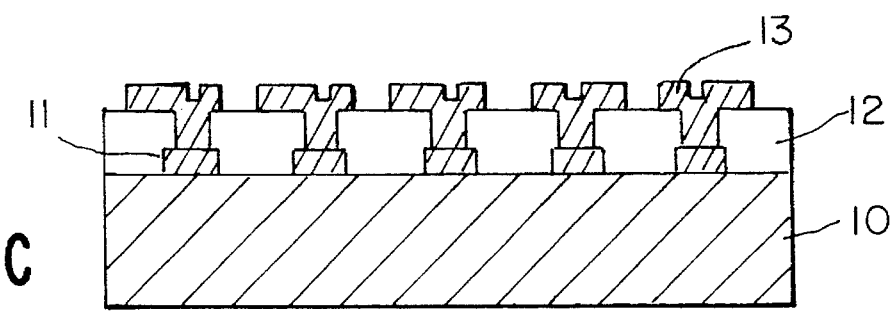

Then precuring and curing are conducted to selectively form the polyimide resin layer 12 of 10 μm in film thickness, and as shown in FIG. 4C, the signal wiring layer 13 of 10 μm in thickness is formed over the polyimide resin layer 12 by a similar method to the case of FIG. 4A.

Figure 4D:
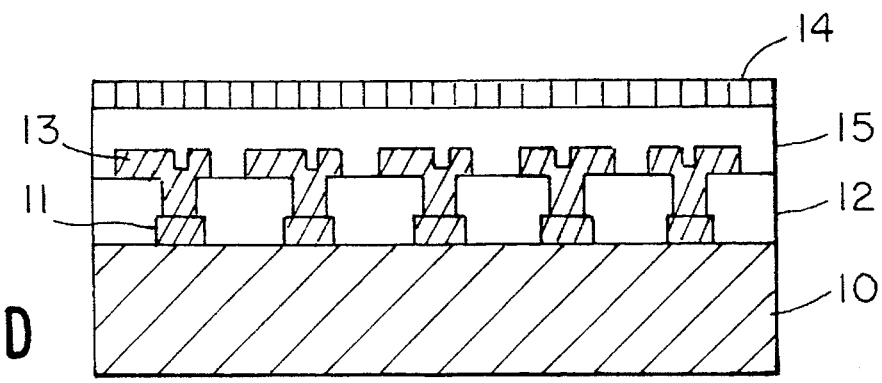

As shown in FIG. 4D, polyimide varnish is applied, precured and cured to form a polyimide resin layer 15 of 10 μm in thickness.

Adhesive including some kind of polyimide is applied over the polyimide resin layer 15 and cured to form the adhesive layer 14 of 10 μm in thickness.

Next, the etching pattern is formed over the adhesive layer 14 by photolithography using a photoresist 16 to bore parts for electrical connection with other blocks.

Since the photoresist 16 serves as the mask for processing by excimer laser in a subsequent process, it is formed of about 50 μm in thickness.

Figure 4E:
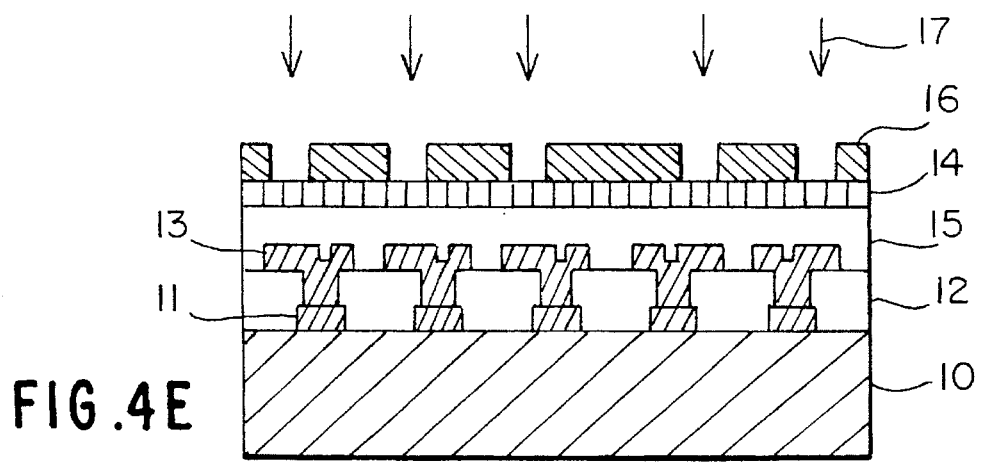
Figure 4F:
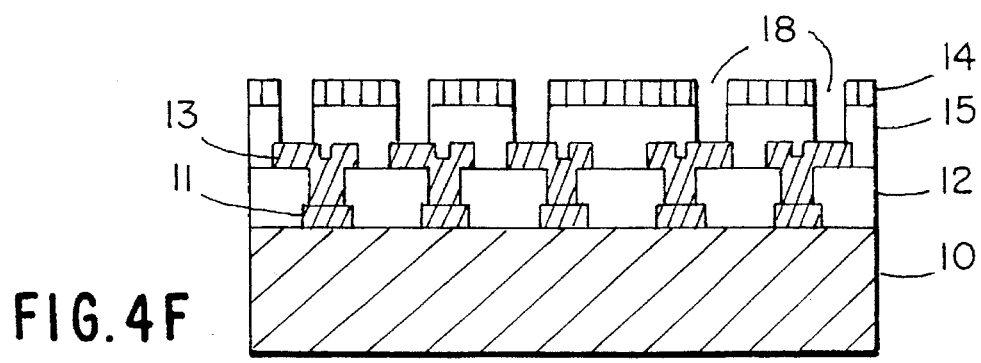

As shown in FIG. 4E, scanning with an excimer laser beam 17 is conducted over the photoresist 16 to form, as shown in FIG. 4F, via holes 18 through the polyimide resin layer 15 and the adhesive layer 14.

In this case, KrF excimer laser is preferably oscillated at a frequency of 200 Hz to form via holes 18 through the polyimide resin layer 15 and the adhesive layer 14 at selected location determined by the photoresist 16.

The scanning speed of KrF excimer laser is adjusted for optimizing the shape of via holes 18, which should have vertical walls. After that, the remaining dust of the photoresist 16, the adhesive layer 14 and the polyimide resin layer 15 are treated with plasma to be completely cleaned up. The bore of via holes 18 is preferably about 200 μm at this time.

Figure 4G:
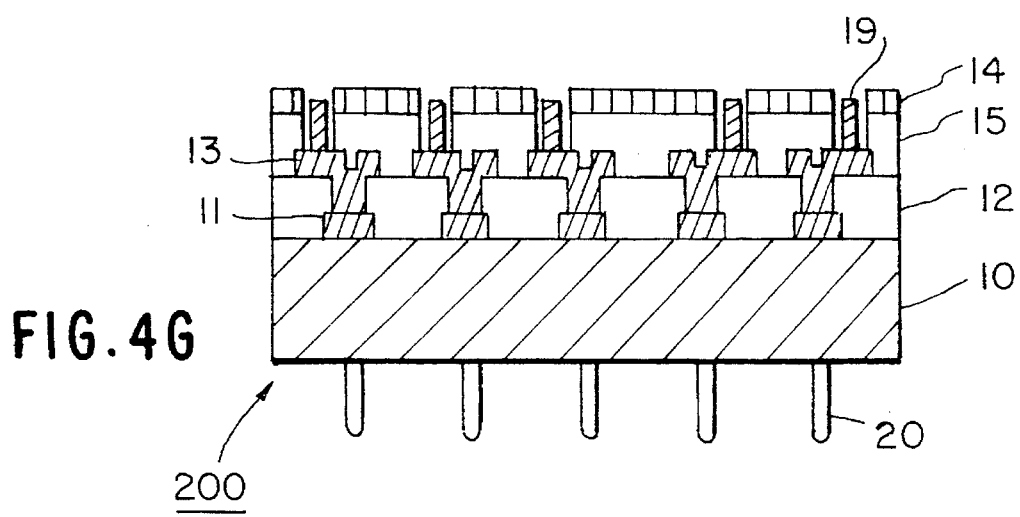

As shown in FIG. 4G, connecting pads 19 are formed on the signal wiring layer 13 in the via holes 18 to achieve electrical connection with the multiple wiring layers of other blocks.

The pads 19 are patterned by photolithography using a photoresist, and formed by multi-layer coating including electrolytic nickel coating and electrolytic gold coating.

This nickel coating is used to prevent gold/tin soldering metal from diffusing to the signal wiring layer 13 including electrolytic gold coating.

Nickel coating and gold coating are preferably about 3 μm and 10 μm in thickness, respectively, and the bore of the pads 19 is preferably about 150 μm.

Thus the block 200 which constitutes the base block is obtained by continuing the above-mentioned manufacturing process.

Next will be described the procedure of manufacturing the blocks 101 and 102 shown in FIG. 3 with reference to FIGS. 5A through 5F.

One layer of the signal wiring layer 41A and the electrode layer 41B having pads or bumps for electrical connection with other blocks are formed by the following manufacturing processes over the topside and the underside of the ceramic substrate 1 having the grounding layer 2 and the throughholes 3 within, respectively.

By alternately performing the stacking on the topside and the underside of the substrate 1, the stresses working on the ceramic substrate attributable to the multiple polyimide wiring layers are cancelled with each other to ease the warp of the ceramic substrate.

Figure 5A:
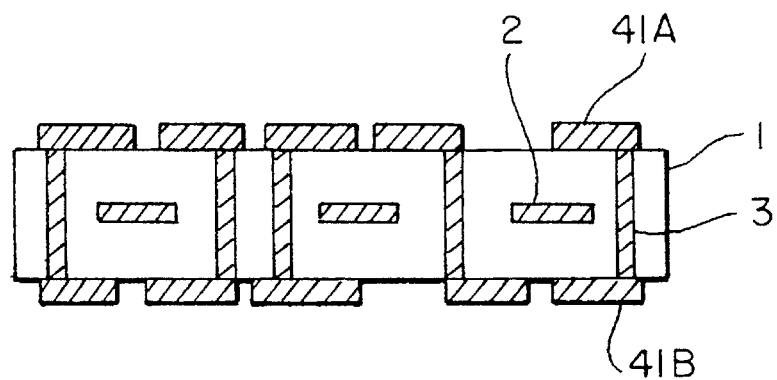
FIGS. 5A through 5F are cross-sectional views illustrating
the process sequence of another embodiment of the manufacturing method for multi-layer wiring boards according to
the present invention.

As shown in FIG. 5A, the signal wiring layer 41A and the electrode 41B are patterned by photolithography using a photoresist over the surfaces of the ceramic substrate 1 having the grounding layer 2 and the throughholes 3 within, and electrolytic gold coating is carried out to form signal wiring layers 41A and the electrode 41B of preferably about 10 μm in thickness.

Figure 5B:
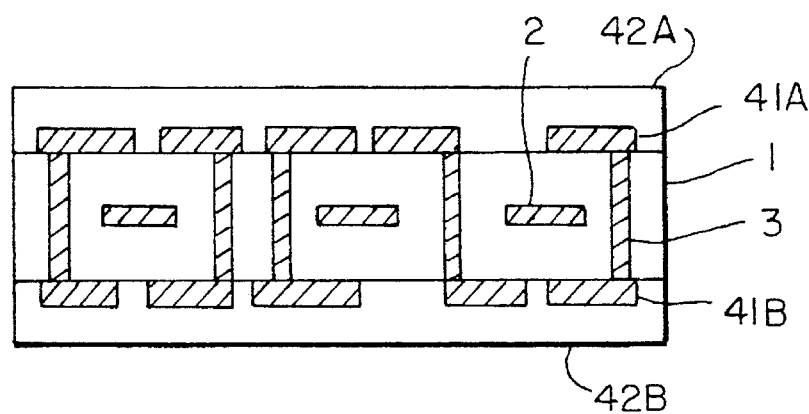

Next, as shown in FIG. 5B, polyimide varnish is applied over both sides of the ceramic substrate 1, precured and cured to form polyimide resin layers 42A and 42B of preferably about 10 μm in thickness.

Figure 5C:
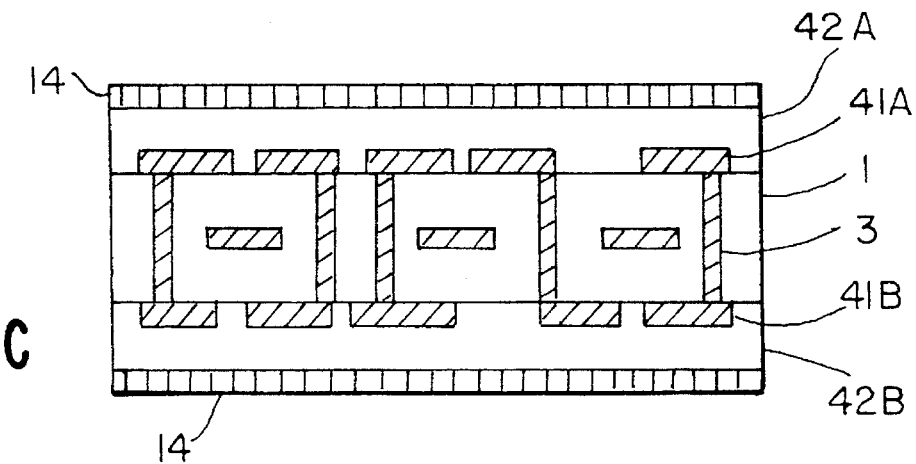

Next, as shown in FIG. 5C, adhesive including some kind of polyimide is applied over the polyimide resin layers 42A and 42B and cured to form adhesive layers 14 of preferably about 10 μm in thickness.

Figure 5D:
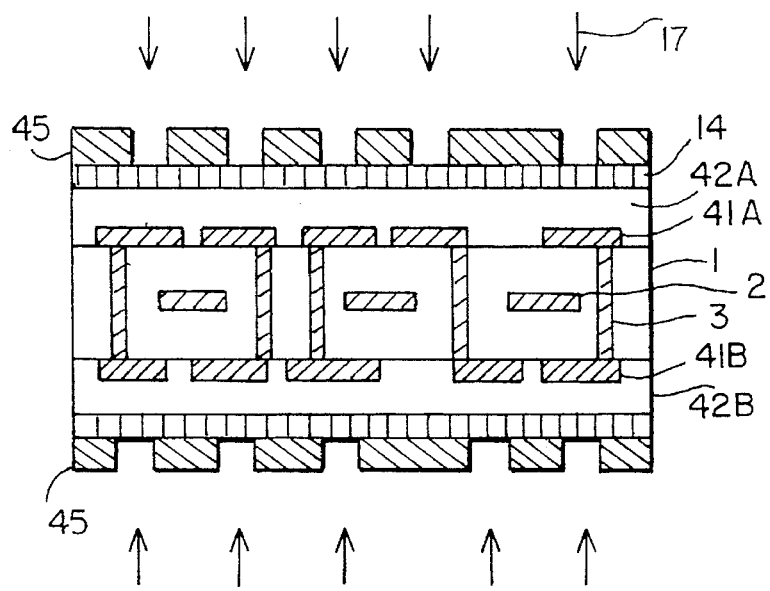

Next, as shown in FIG. 5D, the etching pattern is formed over the adhesive layers 14 by photolithography using a photoresist 45 to bore parts for electrical connection with other blocks.

Since the photoresist 45 serves as the mask for processing by excimer laser in a subsequent process, it is formed of about 50 μm in thickness.

Figure 5E:
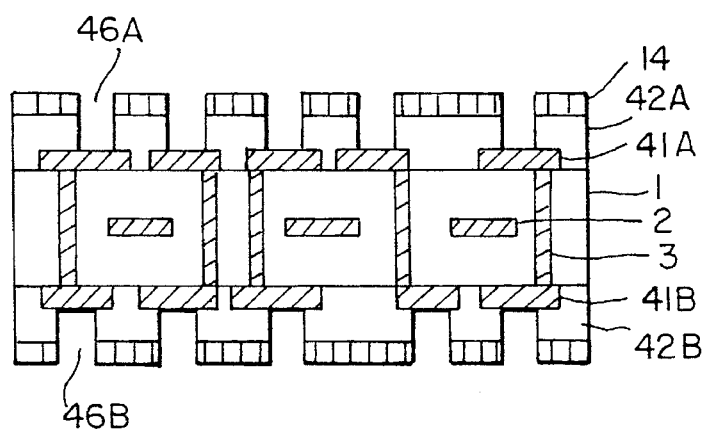

Scanning with an excimer laser beam 17 is conducted over the photoresist 45 to form via holes 46A and 46B through the polyimide resin layers 42A and 42B and the adhesive layers 14 as shown in FIG. 5E.

In this case, KrF excimer laser is oscillated at a frequency of 200 Hz to form via holes 46A and 46B through the polyimide resin layers 42A and 42B and adhesive layers 14.

The scanning speed of KrF excimer laser is adjusted for optimizing the shape of via holes 46A and 46B, which should have vertical walls. After that, the remaining dust of the photoresist 45, the adhesive layer 14 and the polyimide resin layers 42A and 42B are treated with plasma to be completely cleaned up. The bore of via holes 46A and 46B are preferably about 200 μm at this time.

Figure 5F:
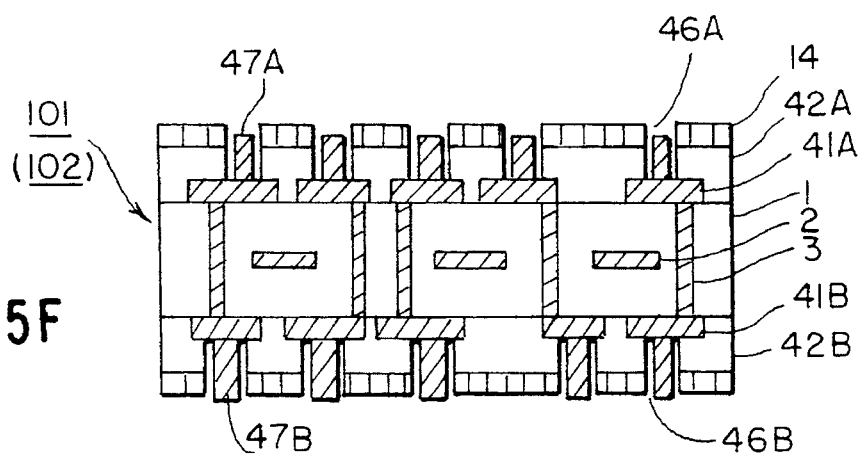

As shown in FIG. 5F, connecting pads 47A are formed on the signal wiring layer 41A in the via holes to achieve electrical connection with the multiple wiring layers of other blocks.

The connecting pads 47A are patterned by photolithography using a photoresist, and formed by multi-layer coating including electrolytic nickel coating and electrolytic gold coating.

This nickel coating is used to prevent gold/tin soldering metal from diffusing to the signal wiring layer 41A which includes electrolytic gold coating.

Nickel coating and gold coating are preferably formed of about 3 μm and 10 μm in thickness, respectively, and the bore of the connecting pads 47A is preferably about 150 μm.

At the same time, connecting bumps 47B are formed on the signal wiring layers 41B in the via holes 46B to achieve electrical connection with the multiple wiring layers of other blocks.

The connecting bumps 47B are patterned by photolithography using a photoresist, and formed by multi-layer coating including electrolytic nickel coating, electrolytic gold coating, electrolytic tin coating and electrolytic gold coating in order.

This nickel coating is used to prevent gold/tin soldering metal from diffusing to the signal wiring layers 41B which includes electrolytic gold coating.

The coating thickness is preferably about 3 μm for nickel, about 8 μm for gold, about 11 μm for tin and about 8 μm for gold, respectively, and the bore of the connecting bumps 47B is preferably about 100 μm. At this time, the gold and tin coating are formed in the weight ratio of 4:1.

Next will be described the procedure of manufacturing the block 100 shown in FIG. 3 with reference to FIGS. 6A through 6E.

Figure 6A:
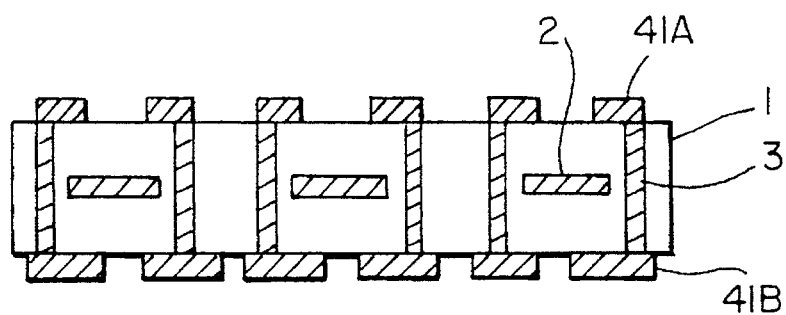
FIGS. 6A through 6E are cross-sectional views illustrating the process sequence of still another embodiment of the
manufacturing method for multi-layer wiring boards according to the present invention.

As shown in FIG. 6A, connecting pads 41A for connecting LSI chips by soldering are patterned by photolithography using a photoresist over the surface of the ceramic substrate 1 having the grounding layer 2 and the through-holes 3 within, and formed by multi-layer coating including electrolytic nickel coating and electrolytic copper coating.

The electrolytic nickel coating is used as a barrier layer against solders by which LSI chips are connected on the connecting pads 41A.

A signal wiring layer 41B and an electrode layer having connecting bumps for electrical connection with other blocks are formed over the underside of this ceramic substrate 1 by the following manufacturing processes.

Figure 6B:
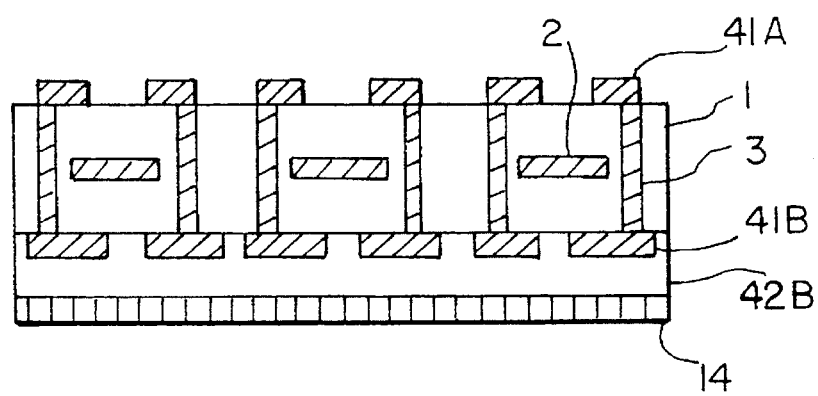

As shown in FIG. 6B, a signal wiring layer 41B is patterned by photolithography using a photoresist over the underside of the ceramic substrate 1, and electrolytic gold coating is carried out to form a signal wiring layer 41B of about 10 μm in thickness.

Next, polyimide varnish is applied over the underside of the ceramic substrate 1, precured and cured to form polyimide resin layer 42B preferably of about 10 μm in thickness.

Adhesive including some kind of polyimide is applied over this polyimide resin layer 42B and cured to form adhesive layer 14 preferably of about 10 μm in thickness.

Figure 6C:
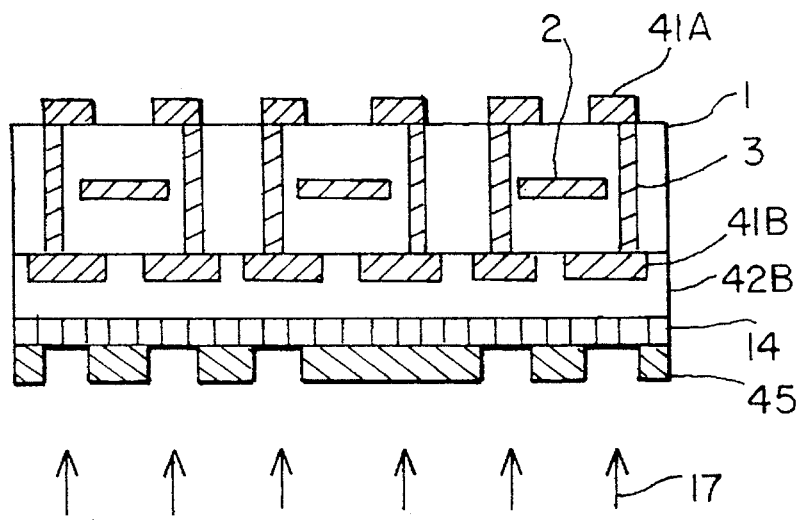

As shown in FIG. 6C, the etching pattern is formed over the adhesive layer 14 by photolithography using a photoresist 45 to bore parts for electrical connection with other blocks.

Since the photoresist 45 serves as the mask for processing by excimer laser in a subsequent process, it is formed of about 50 μm in thickness.

Figure 6D:
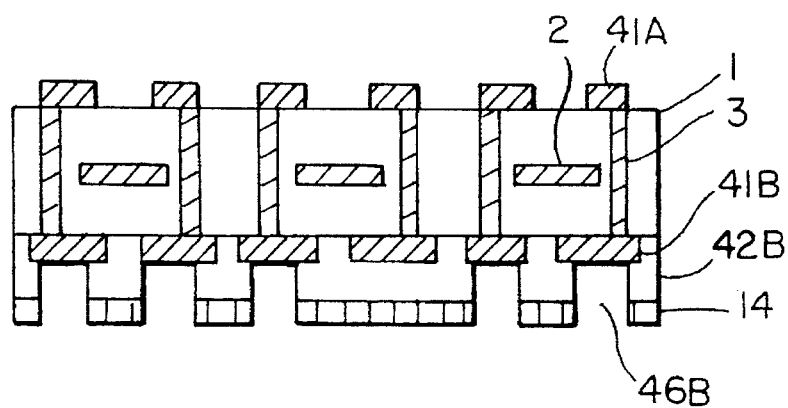

As shown in FIG. 6D, scanning with an excimer laser beam 17 is conducted over the photoresist 45 to form via holes 46B through the polyimide resin layer 42B and the adhesive layer 14.

In this case, KrF excimer laser is oscillated at a frequency of 200 Hz to form via holes 46B through the polyimide resin layer 42B and the adhesive layer 14.

The scanning speed of KrF excimer laser is adjusted for optimizing the shape of via holes 46B, which should have vertical walls. After that, the remaining dust of the photoresist 45, the adhesive layer 14 and the polyimide resin layer 42B are treated with plasma to completely clean up. The bore of via holes 46B are preferably about 200 μm at this time.

Figure 6E:
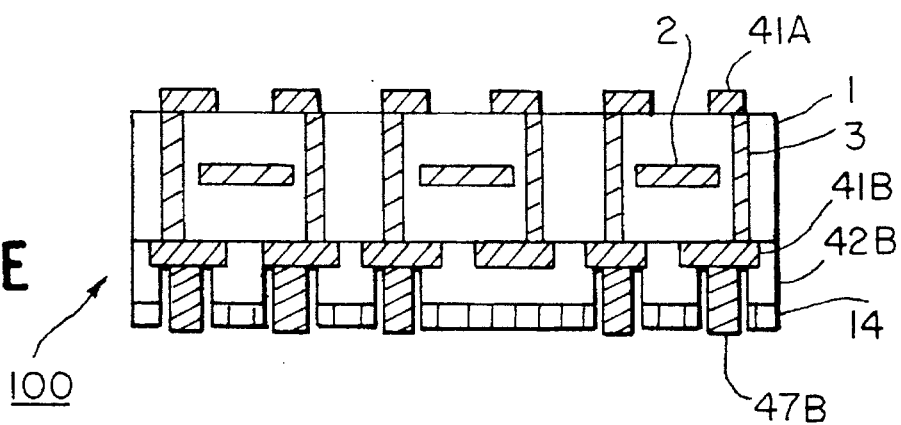

As shown in FIG. 6E, connecting bumps 47B are formed on the signal wiring layer 41B in the via holes 46B to achieve electrical connection with the multiple wiring layers of other blocks.

The connecting bumps 47B are patterned by photolithography using a photoresist, and formed by multi-layer coating including electrolytic nickel coating, electrolytic gold coating, electrolytic tin coating and electrolytic gold coating in order.

This nickel coating is used to prevent gold/tin soldering metal from diffusing to the signal wiring layer 41B including electrolytic gold coating.

The coating thickness is preferably about 3 μm for nickel, about 8 μm for gold, about 11 μm for tin and about 8 μm for gold, respectively, and the bore of the connecting bumps 47B is preferably about 100 μm. At this time, the gold and tin coating are formed in the weight ratio of 4:1.

Next will be described the procedure of manufacturing a multi-layer wiring board structure by using block 100 shown in FIGS. 6A through 6E, blocks 101 and 102 shown in FIGS. 5A through 5F, and block 200 shown in FIGS. 4A through 4G.

Figure 7:
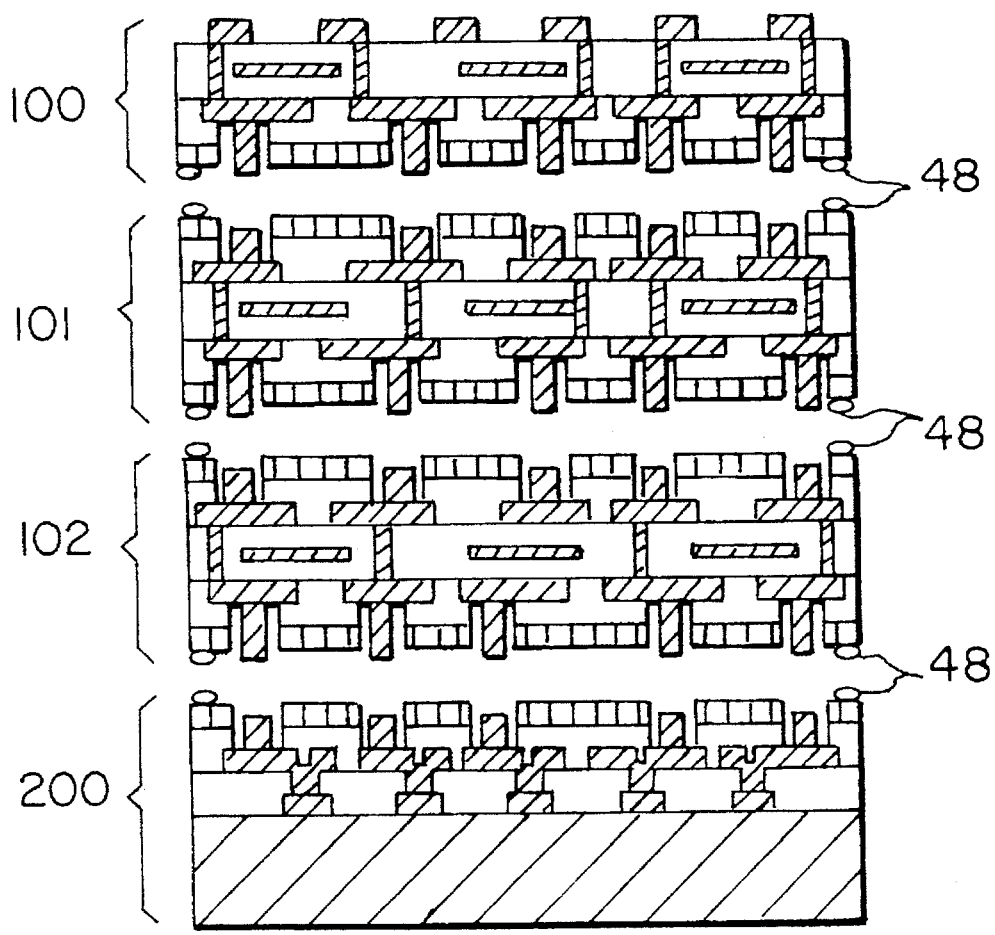
FIG. 7 is an illustrative diagram for mutually adhering
each block obtained according to FIGS. 4A through 6E.

For this example, it will be assumed that a multi-layer wiring board has a total of 6 signal wiring layers as shown in FIG. 7. The manufacturing process for such a multi-layer wiring board will be described below.

First, two blocks 101 and 102 formed by the processes shown in FIGS. 5A through 5F are aligned over the base block 200 formed by the processes shown in FIGS. 4A through 4G. After that, two blocks 101 and 102 and the base block 200 are stacked and adhered with temporary adhesive 48 to adhere one to another.

Second, the block 100 formed by the processes shown in FIGS. 6A through 6E is similarly aligned over the block 101.

After that, the block 100 and the block 101 are stacked and adhered with temporary adhesive 48 to form one integrated board.

In this case, it takes about 2 minutes at normal temperature under the pressure of 1 kg/cm$^2$ to adhere one another with temporary adhesive 48.

Moreover, this laminated board is subjected to pressurizing and heating in a vacuum within an auto-cleave apparatus for finally cleaving the polyimide adhesive layers 14 with each other and the electrodes (the connecting pads 19 and 47A and the connecting bumps 47B) with each other, formed on the top layer of each block.

In this case, it takes about 30 minutes at 350° C. under the pressure of 20 kg/cm$^2$ to cleave one another with the polyimide adhesive layers 14.

Since polyimide adhesive is fluidized under these conditions, and the polyimide adhesive layers 14 become integrated with each other, it is possible to achieve firm and tight adherence between the blocks.

Figure 8:
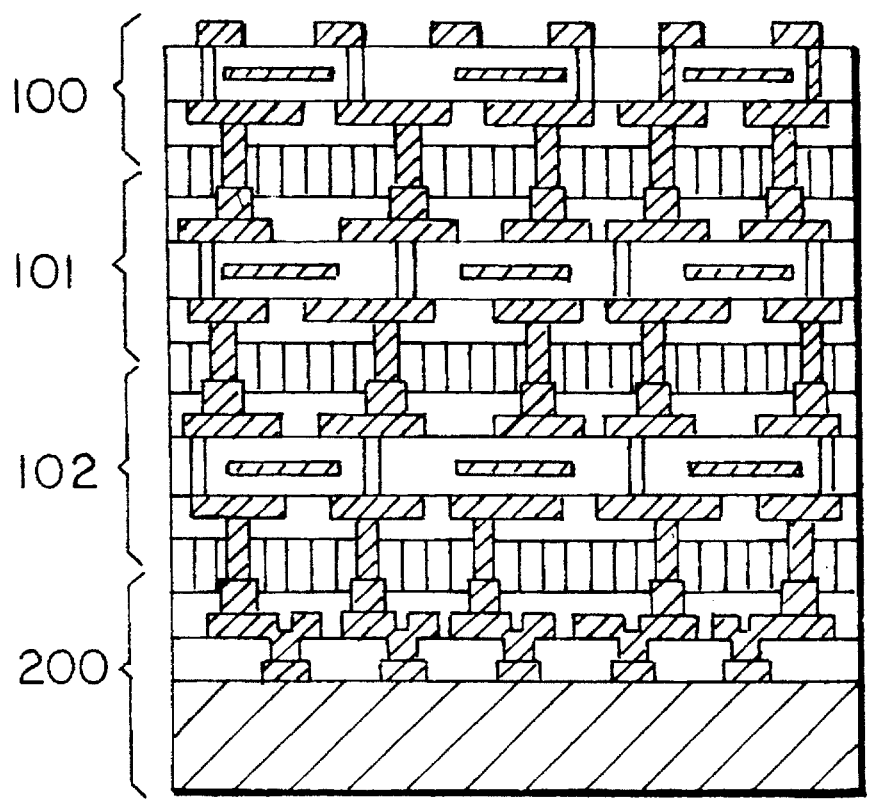
FIG. 8 is a cross-sectional view of the structure of
multi-layer wiring boards obtained by the manufacturing
method according to FIGS. 4A through 7.

At the same time, the connecting bumps 47B formed by multi-layer coating including electrolytic gold coating and electrolytic tin coating become melted at 280° C., which is their eutectic point, and become connected to corresponding connecting pads 19 and 47A. It is thereby possible to achieve sufficient electrical connection between the blocks after pressing as shown in FIG. 8.

Finally, input/output pins and power supply pins 20 are assembled in their respectively prescribed positions on the underside of the insulating base substrate 10 to complete the multi-layer wiring board structure shown in FIG. 3.

Incidentally, although the hard substrate of each block may be made of ceramic in the above-described embodiments, it is evident that hard heat-resistant organic resin, glass ceramic or the like can be used in the hard substrate, and solders which are alloys of gold can be used besides only gold as the materials for the: pads and bumps for inter-block connection. Furthermore, the number of multiple wiring layers is not limited to those in the above-described embodiments, and that of blocks to be stacked also permits various modifications.

As heretofore described, according to the present invention, by composing an insulating hard substrate having a grounding layer and throughholes within, and a plurality of wiring layers formed over the topside and the underside thereof into one block, stacking a plurality of such blocks into a laminated structure, adhering the blocks by adhesion between adhesive layers formed over the top layers, on the upper and lower sides, of each block, and achieving electrical connection between the blocks by connection between the soldered electrodes formed on the surfaces of each block, the penetrating throughholes, which are physically roughly formed through from the top printed wiring board to the bottom printed wiring board with a drill in conventional multiple printed wiring board, are dispensed with due to the formation of the penetrating throughholes with a drill in only the insulating base substrate of the base block, and it is possible to achieve a large accommodation capacity for signal wiring, a greater number of multiple wiring layers and high-density wiring since the minute pattern can be formed in the signal wiring layer parts.

Moreover, the multiple repetition of the curing process required for conventional polyimide ceramic multi-layer wiring boards is dispensed with to make it possible to reduce the time required for the manufacture of wiring boards, to prevent thermal deterioration of polyimide resin by the multiple repetition of the curing process, and to enable satisfactory blocks to be selected for stacking since it is possible to electrically test the wiring layers block by block.

Furthermore, since a ceramic substrate or a hard organic resin substrate is used as the base substrate within the base block, even if the required number of layers for the multiple wiring layer part is increased, it is possible to reduce such trouble as cracks in the polyimide resin insulating layer of multiple wiring layer part or its coming off the ceramic substrate or the hard organic resin substrate due to the thermal deterioration and deformation of the polyimide resin insulating layer of multiple wiring layer part by the multiple repetition of the heat supplying process. Therefore, the present invention has the effect to enable polyimide multi-layer wiring boards of high quality, increased in the number of multiple layers, and of high density to be manufactured in a smaller number of days and, moreover, in a high manufacturing yield.

Although the present invention has been fully described by way of a preferred embodiment thereof with reference to the accompanying drawings, various changes and modifications will be apparent to those having skill in this field. Therefore, unless these changes and modifications otherwise depart from the scope of the present invention, they should be construed as included therein.

What is claimed is:

1. A manufacturing method for multi-layer wiring boards, comprising the steps of:

(a) providing a base block by forming at least one wiring layer over one major surface of an insulating base substrate;

(b) providing at least one stacking block by forming a grounding layer and throughholes in an insulating hard substrate, and wiring layers over each major surface of said insulating hard substrate;

(c) forming selectively an adhesive layer on the top layer of one major surface of said base block and on a major surface of said at least one stacking block; and (d) laminating said at least one stacking block over said base block and applying pressure to said blocks to bond said blocks to each other using said adhesive layer, to electrically and mechanically connect said blocks to each other.

* * * * *